US012159558B2

(12) United States Patent
Lee et al.

(10) Patent No.: US 12,159,558 B2
(45) Date of Patent: *Dec. 3, 2024

(54) DISPLAY MODULE

(71) Applicant: Samsung Display Co., Ltd., Yongin-si (KR)

(72) Inventors: Chansong Lee, Suwon-si (KR); Jihwa Lee, Hwaseong-si (KR); Minju Oh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/229,389

(22) Filed: Aug. 2, 2023

(65) Prior Publication Data

US 2023/0377490 A1 Nov. 23, 2023

Related U.S. Application Data

(63) Continuation of application No. 17/739,644, filed on May 9, 2022, now Pat. No. 11,749,139, which is a continuation of application No. 16/877,830, filed on May 19, 2020, now Pat. No. 11,348,487.

(30) Foreign Application Priority Data

Jul. 22, 2019 (KR) .................. 10-2019-0088418

(51) Int. Cl.
*G09F 9/30* (2006.01)
*H10K 50/86* (2023.01)
*H10K 102/00* (2023.01)

(52) U.S. Cl.
CPC ............. *G09F 9/301* (2013.01); *H10K 50/86* (2023.02); *H10K 2102/311* (2023.02)

(58) Field of Classification Search
CPC ...... G09F 9/301; G06F 1/1613; G06F 1/1652; G06F 2203/04102; G02F 1/133305; G02F 1/133308; G02F 1/133331; G02F 2202/28; H10K 50/86; H10K 2102/311
See application file for complete search history.

(56) References Cited

U.S. PATENT DOCUMENTS

| 6,878,441 | B2 | 4/2005 | Kondo et al. |
| 10,029,446 | B2 | 7/2018 | Lee et al. |
| 10,240,068 | B2 | 3/2019 | Nam et al. |
| 10,423,257 | B2 | 9/2019 | Song et al. |
| 10,504,971 | B2 | 12/2019 | Yang et al. |

(Continued)

FOREIGN PATENT DOCUMENTS

| CN | 106960849 A | 7/2017 |
| CN | 108352458 A | 7/2018 |

(Continued)

*Primary Examiner* — Joe H Cheng
(74) *Attorney, Agent, or Firm* — CANTOR COLBURN LLP

(57) ABSTRACT

A display module includes a display panel, a plurality of functional layers disposed on the display panel, and an adhesive layer disposed between the plurality of functional layers or between one of the plurality of functional layers and the display panel. The adhesive layer has a storage modulus equal to or greater than about 0.02 megapascal (MPa) and equal to or smaller than about 0.045 MPa at a temperature of about 60 degrees Celsius (° C.) and has creep characteristics equal to or greater than about 10 percent (%) and equal to or smaller than about 30%.

19 Claims, 13 Drawing Sheets

(56) References Cited

U.S. PATENT DOCUMENTS

| | | |
|---|---|---|
| 10,586,941 B2 | 3/2020 | Lee et al. |
| 10,620,465 B2 | 4/2020 | Lee et al. |
| 10,871,802 B2 | 12/2020 | Yug |
| 11,257,875 B2 | 2/2022 | Yang et al. |
| 11,348,487 B2 | 5/2022 | Lee et al. |
| 11,404,655 B2 | 8/2022 | Choi et al. |
| 11,502,270 B2 | 11/2022 | Song et al. |
| 11,518,919 B2 | 12/2022 | Song et al. |
| 2007/0148186 A1 | 6/2007 | Ketzis |
| 2013/0224416 A1 | 8/2013 | Cho et al. |
| 2014/0178622 A1 | 6/2014 | Fuchi et al. |
| 2015/0200375 A1 | 7/2015 | Kim et al. |
| 2015/0266272 A1 | 9/2015 | Lee et al. |
| 2015/0268697 A1 | 9/2015 | Nam et al. |
| 2015/0346408 A1 | 12/2015 | Mizutani et al. |
| 2016/0285051 A1 | 9/2016 | Lee et al. |
| 2017/0002237 A1 | 1/2017 | Cho et al. |
| 2017/0015880 A1 | 1/2017 | Kim et al. |
| 2017/0028677 A1 | 2/2017 | Lee et al. |
| 2017/0043566 A1 | 2/2017 | Kanno et al. |
| 2017/0121564 A1 | 5/2017 | Cho et al. |
| 2017/0145262 A1 | 5/2017 | Nam et al. |
| 2017/0200915 A1 | 7/2017 | Lee et al. |
| 2017/0309867 A1 | 10/2017 | Mun et al. |
| 2017/0317315 A1 | 11/2017 | Yang et al. |
| 2018/0046220 A1 | 2/2018 | Kim et al. |
| 2018/0136371 A1 | 5/2018 | Kim et al. |
| 2018/0203321 A1 | 7/2018 | Shin et al. |
| 2018/0291240 A1 | 10/2018 | Behling et al. |
| 2019/0086709 A1 | 3/2019 | Lee et al. |
| 2019/0273212 A1 | 9/2019 | Shin et al. |
| 2020/0224061 A1 | 7/2020 | Oh et al. |
| 2020/0239738 A1 | 7/2020 | Naito et al. |
| 2020/0266368 A1 | 8/2020 | Park et al. |
| 2020/0301474 A1 | 9/2020 | Yug |
| 2020/0395569 A1 | 12/2020 | Song et al. |
| 2021/0139747 A1 | 5/2021 | Du et al. |
| 2021/0187904 A1 | 6/2021 | Jeong et al. |
| 2021/0255367 A1 | 8/2021 | Kim et al. |

FOREIGN PATENT DOCUMENTS

| | | |
|---|---|---|
| JP | 2015080035 A | 4/2015 |
| JP | 2017126061 A | 7/2017 |
| JP | 2018053250 A | 4/2018 |
| KR | 1020120050136 A | 5/2012 |
| KR | 1020160131896 A | 11/2016 |
| KR | 1020170084402 A | 7/2017 |
| KR | 1020170097850 A | 8/2017 |
| KR | 1020170113821 A | 10/2017 |
| KR | 1020180033016 A | 4/2018 |
| KR | 1020180096449 A | 8/2018 |
| KR | 102292101 B1 | 8/2021 |

DISPLAY MODULE

This application is a continuation of U.S. patent application Ser. No. 17/739,644, filed on May 9, 2022, which is a continuation of U.S. patent application Ser. No. 16/877,830, filed on May 19, 2020, now U.S. Pat. No. 11,348,487 B2, which claims priority to Korean Patent Application No. 10-2019-0088418, filed on Jul. 22, 2019, and all the benefits accruing therefrom under 35 U.S.C. § 119, the content of which in its entirety is herein incorporated by reference.

BACKGROUND

1. Field

Exemplary embodiments of the invention relate to a display module. More particularly, exemplary embodiments of the invention relate to a display module having improved reliability and durability when folded.

2. Description of the Related Art

A display device displays various images on a display screen of the display device to provide information to a user. In recent years, a flexible display device is being developed. Differently from a flat panel display device, the flexible display device is able to be folded, rolled, or bent like a paper. Accordingly, the flexible display device is easy to carry and improves a user's convenience due to a transformability into various shapes. The flexible display device is classified into a rollable display device, a foldable display device, or the like.

SUMMARY

Exemplary embodiments of the invention provide a display module that prevents defects from occurring in the display module due to stress caused by folding the display module under a high temperature and has improved reliability and durability when folded.

An exemplary embodiment of the invention provides a display module including a display panel, a plurality of functional layers disposed on the display panel, and an adhesive layer disposed between the plurality of functional layers or between one of the plurality of functional layers and the display panel. The adhesive layer has a storage modulus equal to or greater than about 0.02 megapascal (MPa) and equal to or smaller than about 0.045 MPa at a temperature of about 60 degrees Celsius (° C.) and has creep characteristics equal to or greater than about 10 percent (%) and equal to or smaller than about 30%. In an exemplary embodiment, the adhesive layer may have a thickness equal to or greater than about 25 micrometers and equal to or smaller than about 75 micrometers.

In an exemplary embodiment, the plurality of functional layers may include a window disposed on the display panel.

In an exemplary embodiment, the adhesive layer may include a first adhesive layer disposed between the display panel and the window.

In an exemplary embodiment, the plurality of functional layers may further include an anti-reflection layer disposed between the display panel and the window.

In an exemplary embodiment, the adhesive layer may include a first adhesive layer disposed between the window and the anti-reflection layer and a second adhesive layer disposed between the anti-reflection layer and the display panel.

In an exemplary embodiment, the first adhesive layer and the second adhesive layer may have a same storage modulus and same creep characteristics at a temperature of about 60° C.

In an exemplary embodiment, the window may include a first window, a second window disposed between the first window and the display panel, and a third adhesive layer disposed between the first window and the second window.

In an exemplary embodiment, the plurality of functional layers may further include an input sensing layer disposed between the window and the display panel.

In an exemplary embodiment, the display module may further include a lower film disposed under the display panel and absorbing an impact applied thereto.

In an exemplary embodiment, the display module further may include a fourth adhesive layer disposed between the display panel and the lower film. The fourth adhesive layer may have the storage modulus equal to or greater than about 0.02 MPa and equal to or smaller than about 0.045 MPa at the temperature of about 60° C. and have the creep characteristics equal to or greater than about 10% and equal to or smaller than about 30%.

In an exemplary embodiment, the display panel may be a flexible display panel.

In an exemplary embodiment, the display panel may include a first non-folding area, a folding area, and a second non-folding area, which are sequentially arranged in a first direction.

In an exemplary embodiment, the folding area may be inwardly folded with respect to a first folding axis defined at an upper portion of the display panel and has a radius of curvature of the folding area that is equal to or greater than about 1.0R and equal to or smaller than about 2.0R.

In an exemplary embodiment, each of the plurality of functional layers may have a thickness equal to or greater than about 30 micrometers and equal to or smaller than about 60 micrometers.

An exemplary embodiment of the invention provides a display module including a display panel including a first non-folding area, a folding area, and a second non-folding area, which are sequentially arranged in a first direction, and being folded with respect to a folding axis overlapping the folding area in a plan view, a plurality of functional layers disposed on the display panel, and an adhesive layer disposed between the plurality of functional layers or between one of the plurality of functional layers and the display panel. The adhesive layer has a storage modulus equal to or greater than about 0.02 MPa and equal to or smaller than about 0.045 MPa at a temperature of about 60° C.

In an exemplary embodiment, the adhesive layer may have creep characteristics equal to or greater than about 10% and equal to or smaller than about 30%.

In an exemplary embodiment, the plurality of functional layers may include a window disposed on the display panel and an anti-reflection layer disposed between the display panel and the window.

In an exemplary embodiment, the display module may further include a lower film disposed under the display panel and absorbing an impact applied thereto.

In an exemplary embodiment, the adhesive layer may include a first adhesive layer disposed between the window and the anti-reflection layer, a second adhesive layer disposed between the anti-reflection layer and the display panel, and a third adhesive layer disposed between the display panel and the lower film.

According to the above, the adhesive layer used to adhere the plurality of functional layers disposed on the display panel may be prevented from being peeled due to the folding operation at the high temperature or from being cracked due to stress applied to components adjacent to the adhesive layer, and thus the reliability and durability of the display module may be improved.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1A:
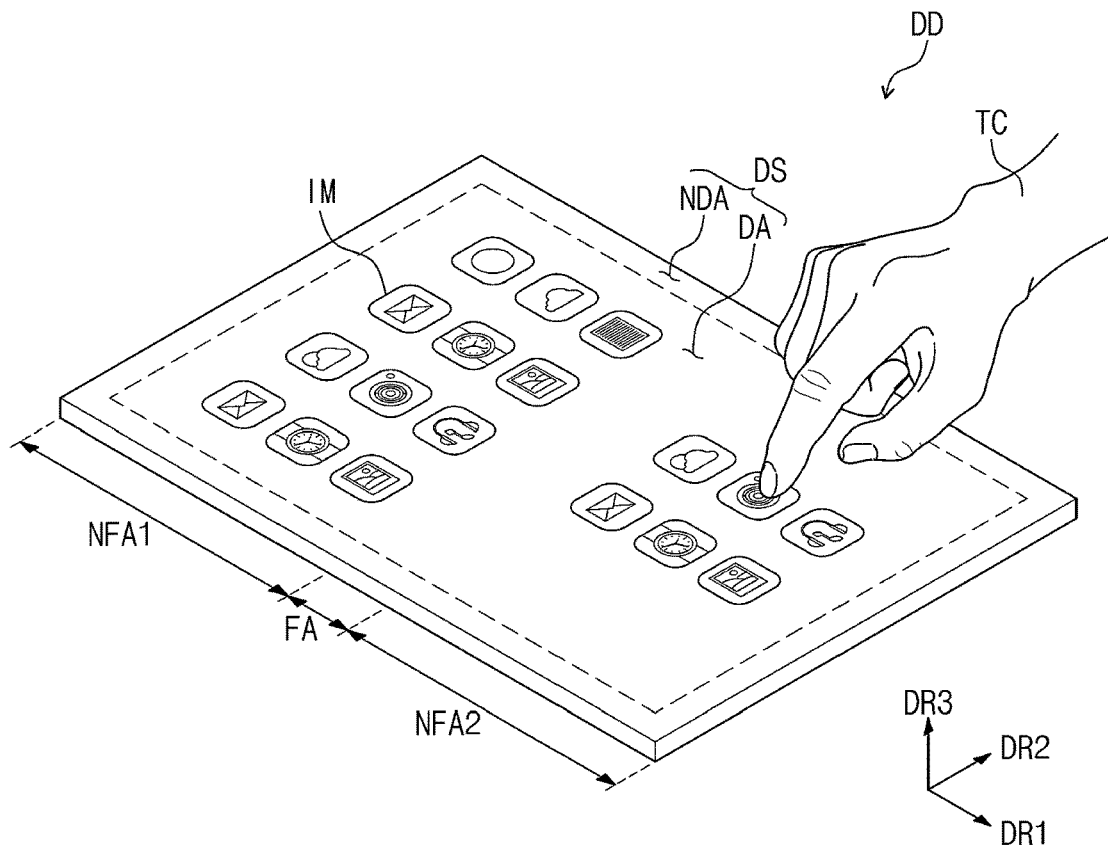
FIG. 1A is a perspective view showing an exemplary embodiment of a display device according to the invention.

Hereinafter, exemplary embodiments of the invention will be explained in detail with reference to the accompanying drawings. The invention and methods of accomplishing the same may be understood more readily by reference to the following detailed description of embodiments and the accompanying drawings. However, the invention may be embodied in many different forms, and should not be construed as being limited to the exemplary embodiments set forth herein. Rather, these embodiments are provided so that this invention will be thorough and complete and will fully convey the concept of the invention to those skilled in the art, and the invention will only be defined by the appended claims.

Like numerals refer to like elements throughout. In the drawings, the thickness, ratio, and dimension of components are exaggerated for effective description of the technical content. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

In the invention, the expression "directly contact" may mean that no additional intervening elements, such as a layer, a film, an area, and a plate, are between the layer, the film, the area, or the plate and other elements. For example, the expression "directly contact" may mean that two layers or members are arranged without using an additional member, such as an adhesive, between the two layers or members.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 1B:
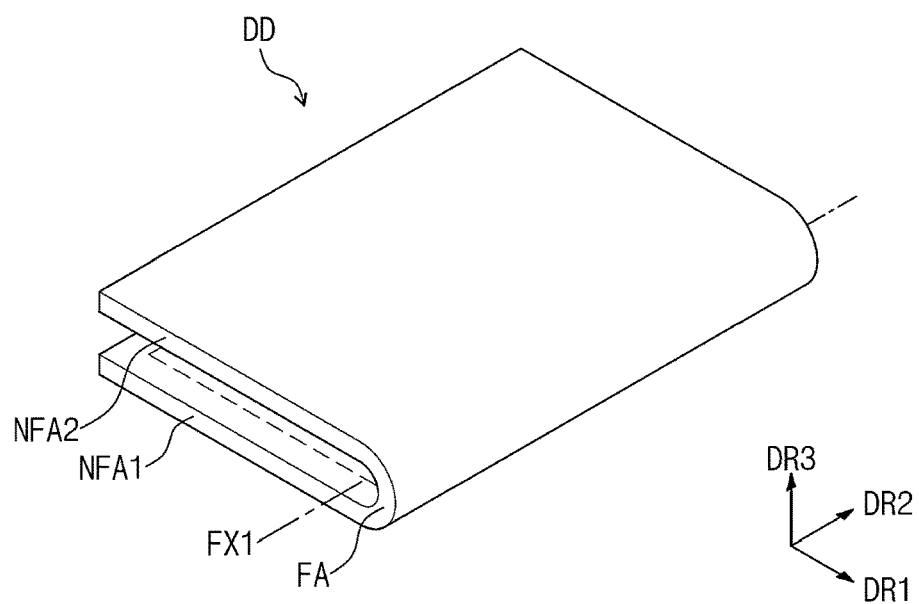
FIG. 1B is a perspective view showing an exemplary embodiment of a folded state of the display device shown in FIG. 1A.
Figure 1C:
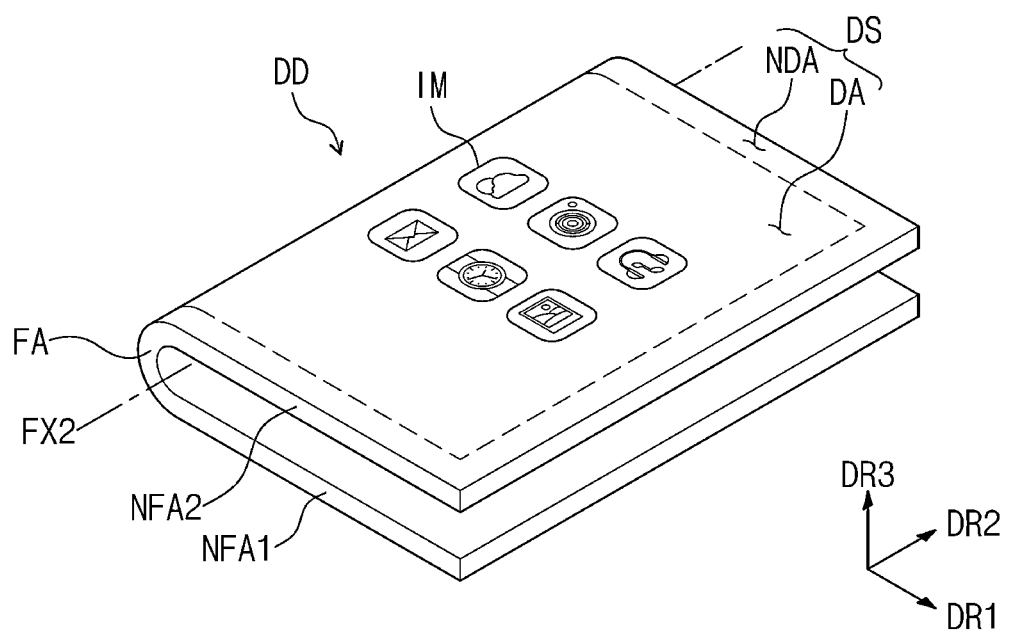
FIG. 1C is a perspective view showing another exemplary embodiment of a folded state of the display device shown in FIG. 1A.

FIG. 1A is a perspective view showing an exemplary embodiment of a display device DD according to the invention. FIG. 1B is a perspective view showing an exemplary embodiment of a folded state of the display device DD shown in FIG. 1A. FIG. 1C is a perspective view showing another exemplary embodiment of a folded state of the display device DD shown in FIG. 1A.

Referring to FIGS. 1A to 1C, the display device DD may be a foldable display device. The display device DD according to the invention may be applied to a large-sized electronic item, such as a television set and a monitor, and a small and medium-sized electronic item, such as a mobile phone, a tablet computer, a car navigation unit, a game unit, and a smart watch.

An upper surface of the display device DD may be defined as a display surface DS, and the display surface DS may include a plane defined by a first direction DR1 and a second direction DR2.

The display surface DS may include a display area DA and a non-display area NDA around the display area DA. An image IM is displayed through the display area DA and is not displayed through the non-display area NDA. FIG. 1A shows application icons as a representative exemplary embodiment of the image IM.

In an exemplary embodiment, the display area DA may have a quadrangular shape, for example. However, the invention is not limited thereto, and the display area DA may include a curved portion. The non-display area NDA may surround the display area DA, for example, however, it should not be limited thereto or thereby. The shape of the display area DA and the shape of the non-display area NDA may be designed relative to each other.

The display device DD may include a first non-folding area NFA1, a folding area FA, and a second non-folding area NFA2, which are sequentially defined therein along the first direction DR1. That is, the folding area FA may be defined between the first non-folding area NFA1 and the second non-folding area NFA2. FIGS. 1A and 1B show one folding area FA and two non-folding areas, e.g., the first and second non-folding areas NFA1 and NFA2, however, the number of the folding areas and the non-folding areas should not be limited thereto or thereby. In an exemplary embodiment, the display device DD may include more than two non-folding areas and folding areas disposed between the non-folding areas, for example.

As shown in FIG. 1B, the display device DD may be folded with reference to a first folding axis FX1. That is, the folding area FA may be folded with reference to the first folding axis FX1. The first folding axis FX1 may extend in the second direction DR2 and may be defined to be adjacent to an upper portion of the display device DD, i.e., the display surface DS. The first folding axis FX1 may be a short axis substantially parallel to short sides of the display device DD.

When the display device DD is inwardly folded (in-folding) along the first folding axis FX1 defined on the upper portion of the display device DD, the display surface corresponding to the first non-folding area NFA1 and the display surface corresponding to the second non-folding area NFA2 may face each other. Accordingly, the display surface DS may not be exposed to the outside in the folded state.

As shown in FIG. 1C, the display device DD may be folded with reference to a second folding axis FX2. That is, the folding area FA may be folded with reference to the second folding axis FX2. The second folding axis FX2 may extend in the second direction DR2 and may be defined to be adjacent to a lower portion of the display device DD, i.e., a rear surface facing the display surface DS. The second folding axis FX2 may be a short axis substantially parallel to the short sides of the display device DD.

When the display device DD is outwardly folded (out-folding) along the second folding axis FX2 defined on the lower portion of the display device DD, the rear surface corresponding to the first non-folding area NFA1 and the rear surface corresponding to the second non-folding area NFA2 may face each other. Accordingly, the display surface DS may be exposed to the outside in the folded state.

Figure 2A:
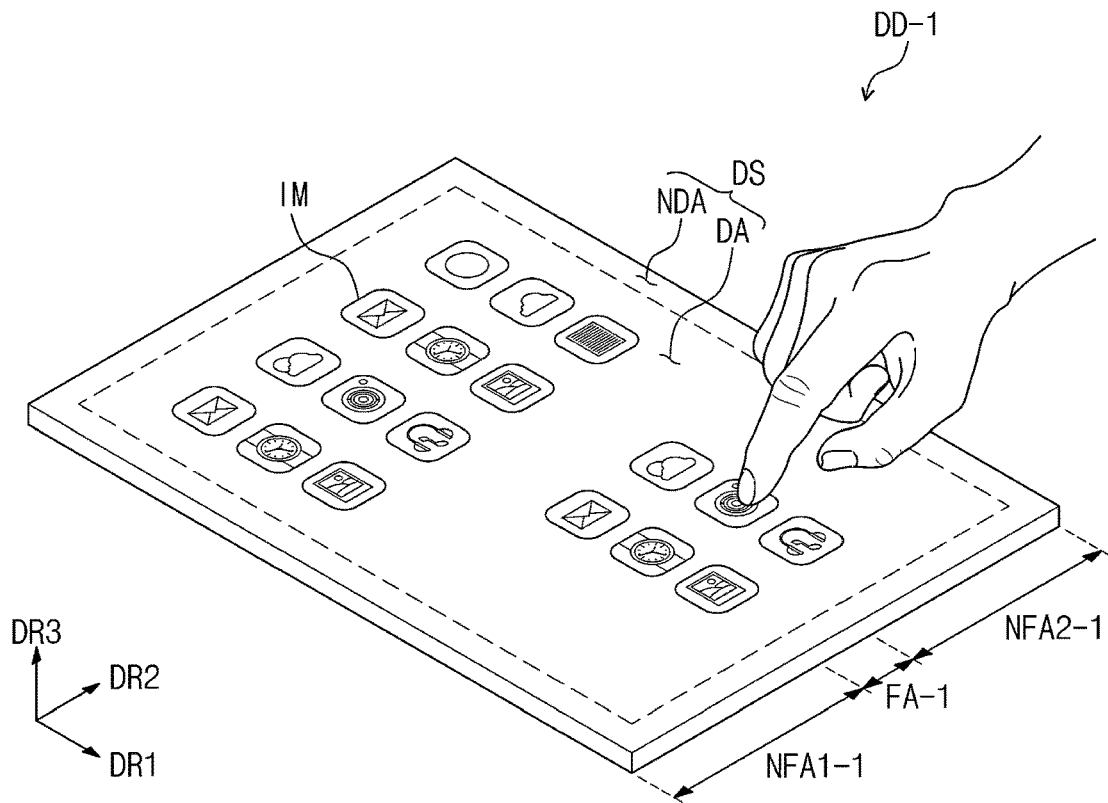
FIG. 2A is a perspective view showing an exemplary embodiment of a display device according to the invention.
Figure 2B:
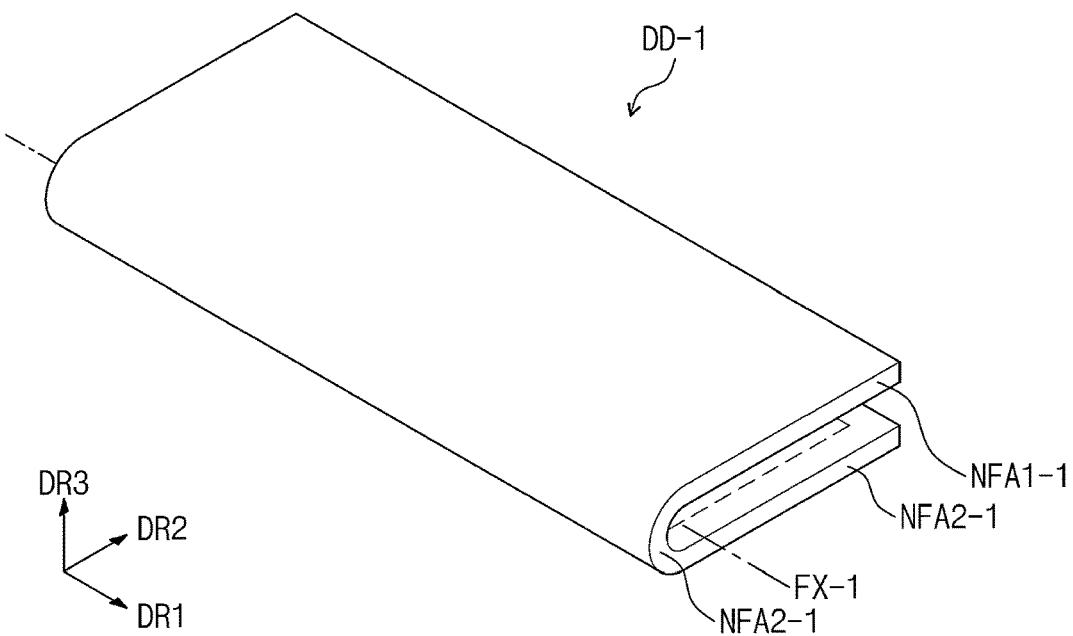
FIG. 2B is a perspective view showing an exemplary embodiment of a folded state of the display device shown in FIG. 2A.
Figure 2C:
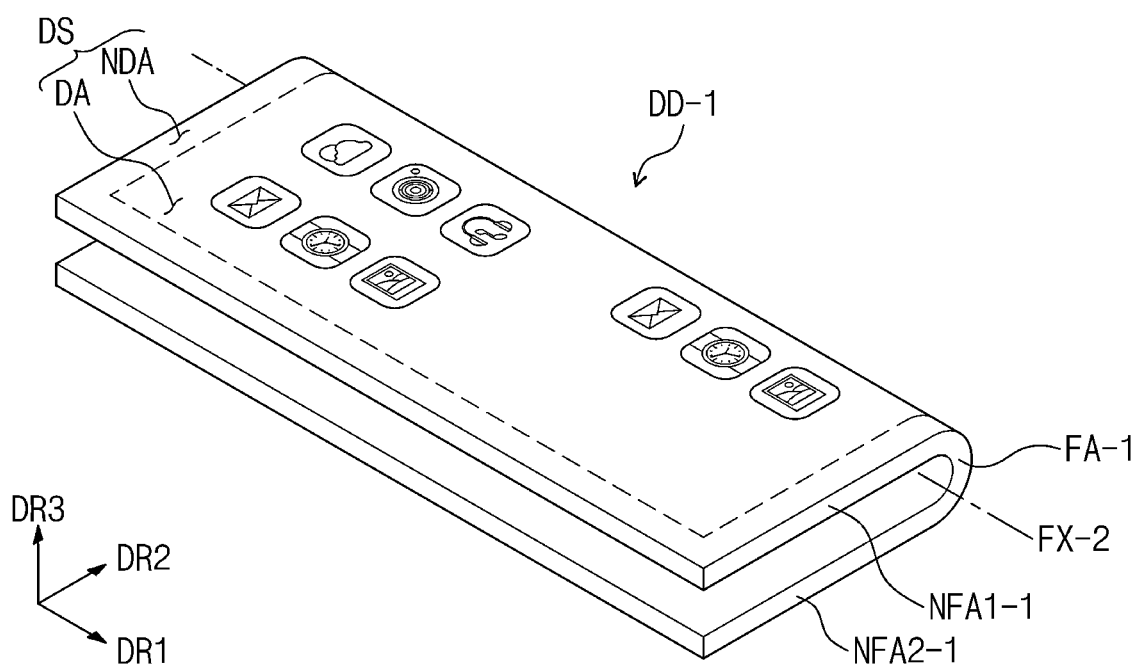
FIG. 2C is a perspective view showing another exemplary embodiment of a folded state of the display device shown in FIG. 2A.

FIG. 2A is a perspective view showing an exemplary embodiment of a display device DD-1 according to the invention. FIG. 2B is a perspective view showing an exemplary embodiment of a folded state of the display device DD-1 shown in FIG. 2A. FIG. 2C is a perspective view showing another exemplary embodiment of a folded state of the display device DD-1 shown in FIG. 2A.

Referring to FIGS. 2A to 2C, the display device DD-1 may include a first non-folding area NFA1-1, a folding area FA-1, and a second non-folding area NFA2-1, which are sequentially defined therein along the second direction DR2. That is, the folding area FA-1 may be defined between the first non-folding area NFA1-1 and the second non-folding area NFA2-1.

As shown in FIG. 2B, the display device DD-1 may be folded with reference to a third folding axis FX-1. That is, the folding area FA-1 may be folded with reference to the third folding axis FX-1. The third folding axis FX-1 may extend in the first direction DR1 and may be defined to be adjacent to an upper portion of the display device DD-1, i.e., the display surface DS. The third folding axis FX-1 may be a long axis substantially parallel to long sides of the display device DD-1.

When the display device DD-1 is inwardly folded (in-folding) along the third folding axis FX-1 defined on the upper portion of the display device DD-1, the display surface corresponding to the first non-folding area NFA1-1 and the display surface corresponding to the second non-folding area NFA2-1 may face each other. Accordingly, the display surface DS may not be exposed to the outside in the folded state.

As shown in FIG. 2C, the display device DD-1 may be folded with reference to a fourth folding axis FX-2. That is, the folding area FA-1 may be folded with reference to the fourth folding axis FX-2. The fourth folding axis FX-2 may extend in the first direction DR1 and may be defined to be adjacent to a lower portion of the display device DD-1, i.e., a rear surface facing the display surface DS. The fourth folding axis FX-2 may be a long axis substantially parallel to the long sides of the display device DD-1.

When the display device DD-1 is outwardly folded (out-folding) along the fourth folding axis FX-2 defined on the lower portion of the display device DD-1, the rear surface corresponding to the first non-folding area NFA1-1 and the rear surface corresponding to the second non-folding area NFA2-1 may face each other. Accordingly, the display surface DS may be exposed to the outside in the folded state.

Hereinafter, a structure of the display device DD folded with reference to the short axis will be described in detail, however, structures described hereinafter may be applied to the display device DD-1 folded with reference to the long axis.

Figure 3:
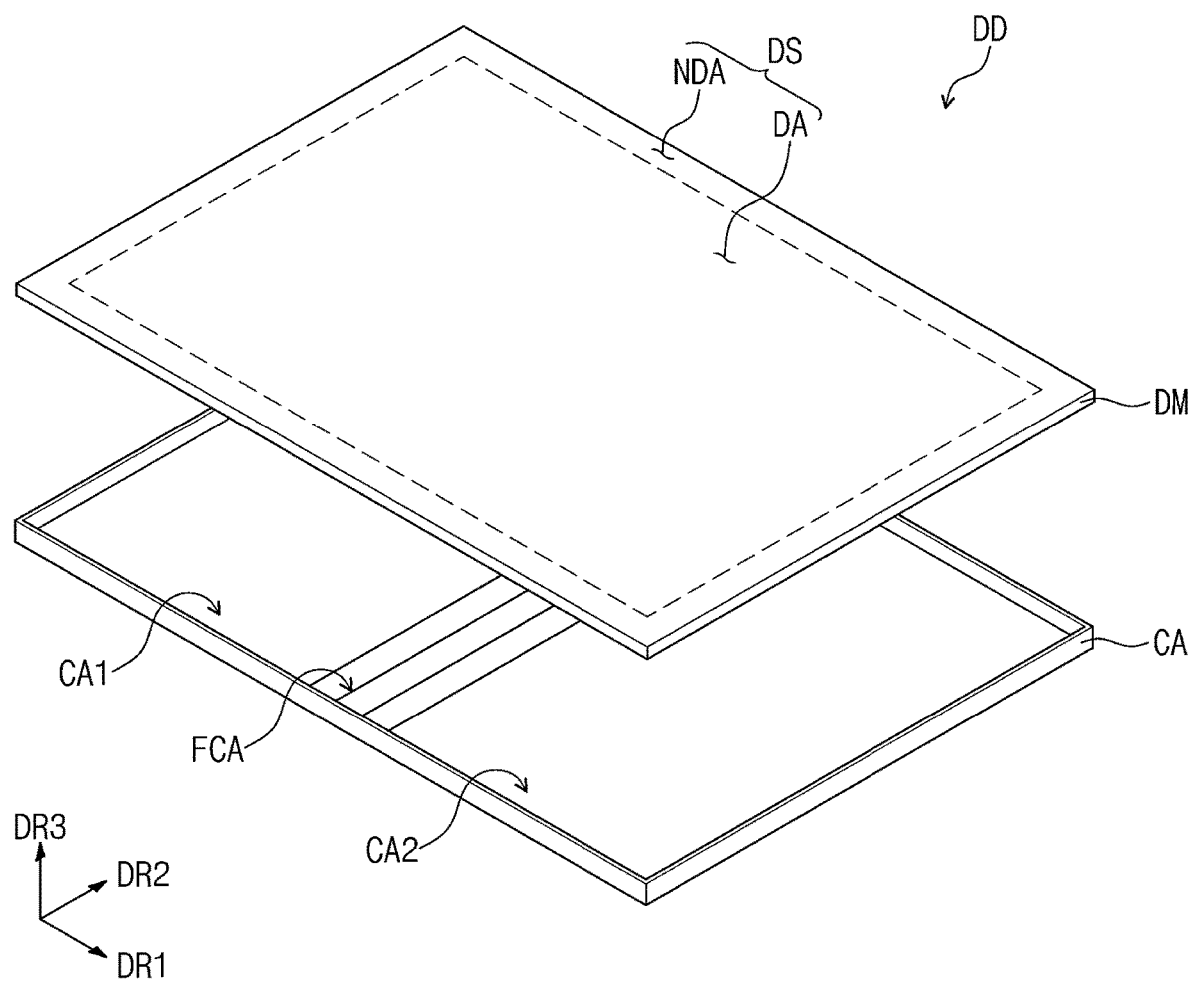
FIG. 3 is an exploded perspective view showing an exemplary embodiment of a display device according to the invention.

FIG. 3 is an exploded perspective view showing an exemplary embodiment of the display device DD according to the invention.

Referring to FIG. 3, the display device DD may include a display module DM and a case member CA.

The display module DM may display the image IM (refer to FIG. 1A) and may sense an external input TC (refer to FIG. 1A). The external input TC may be a user input. In an exemplary embodiment, the user input may include various types of external inputs, such as a part of the user's body, light, heat, or pressure. In FIG. 1A, the external input TC is shown as a user's hand being applied to the display surface DS, however, this is merely exemplary. As described above, the external input TC may be provided in various forms. In addition, the display device DD may sense the external input TC applied to a side or rear surface of the display device DD depending on a structure of the display device DD, however, it should not be limited to a specific exemplary embodiment.

The case member CA may be disposed at an outermost position of the display device DD and accommodate components therein. The case member CA may include a bottom portion and a sidewall extending from the bottom portion. In addition, the display module DM and electronic modules (not shown) may be accommodated in an inner space defined by the bottom portion and the sidewall of the case member CA. In an exemplary embodiment, the electronic modules may include, for example, a camera, a flash, a fingerprint sensor, a battery, and a functional sensor, and the functional sensor may be a proximity sensor, a color density detection sensor, an illuminance sensor, a motion sensor, or a heart rate sensor. However, this is merely exemplary, and the functional sensor should not be limited thereto or thereby. In addition, some of the camera, the flash, the fingerprint sensor, the battery, and the functional sensor may be omitted, and other electronic modules may be further used.

The case member CA may include a material having a relatively high strength as compared with that of the display module DM. In an exemplary embodiment, the case member CA may include a plurality of frames and/or plates including a glass, plastic, or metal material, or combinations thereof, for example. The case member CA may stably protect the components of the display device DD, which are accommodated in the inner space, from external impacts.

In addition, the case member CA may include a first case portion CA1, a second case portion CA2, and a folding case portion FCA. The folding case portion FCA may be disposed between the first case portion CA1 and the second case portion CA2. The folding case portion FCA may have a hinge structure or may include a flexible material.

Although not shown in drawing figures, an adhesive member may further be disposed between the display module DM and the case member CA. A cushion layer may further be disposed between the display module DM and the case member CA.

FIGS. 4A to 4G are cross-sectional views showing an exemplary embodiment of display modules according to the invention. FIGS. 4A to 4G simply show the display modules to explain a stacked relation between functional units and/or functional layers of the display modules.

FIGS. 4A to 4G show a cross-section defined by the first direction DR1 and a third direction DR3. The third direction DR3 may be a direction perpendicular to the plane surface defined by the first direction DR1 and the second direction DR2. In the following descriptions, the expression "in a plan view" may mean a state of being viewed in the third direction DR3.

The display module DM (refer to FIG. 3) in the exemplary embodiment of the invention may include a display panel, a plurality of functional layers disposed on the display panel, and at least one adhesive layer disposed between the display panel and the functional layers or between the functional layers. The functional layers may include at least one of an input sensing unit, an anti-reflection unit, and a window. At least some components among the display panel, the input sensing unit, the anti-reflection unit, and the window may be provided through consecutive processes or at least some components among the display panel, the input sensing unit, the anti-reflection unit, and the window may be coupled to each other by the above-mentioned adhesive layer. The display module DM may be one of the display modules DM-1, DM-2, DM-3, DM-4, DM-5, DM-6, and DM-7 respectively shown in FIGS. 4A to 4G. In the exemplary embodiment of the invention, the anti-reflection unit and the window may be replaced with another functional layer or may be omitted.

In an exemplary embodiment, each of the functional layers may have a thickness from about 30 micrometers to about 60 micrometers along the third direction DR3. When the thickness of each of the functional layers is smaller than about 30 micrometers, the performance of the originally intended function is deteriorated, and when the thickness of each of the functional layers is greater than about 60 micrometers, flexibility of the display module DM is reduced.

In FIGS. 4A to 4G, the adhesive layer is described to include a pressure sensitive adhesive ("PSA"). The adhesive member described hereinafter may include a conventional adhesive or PSA.

The at least one adhesive layer included in the display module in the exemplary embodiment of the invention has a storage modulus equal to or greater than about 0.02 megapascal (MPa) and equal to or smaller than about 0.045 MPa at about 60 degrees Celsius (° C.). In the exemplary embodiment of the invention, the storage modulus is a storage modulus of a material, which is measured by the oscillatory flow experiment, and is obtained by reading a value at a predetermined temperature (e.g., about −20° C., about 25° C., or about 60° C.) when an adhesive film having a thickness of about 800 micrometers is measured in a temperature ramping mode of a Rheometer under conditions of a frequency of about 1 Hertz (Hz) and a temperature rising rate of 5 degrees Celsius per minute (° C./min) within a temperature range of about −60° C. to about 100° C.

The at least one adhesive layer included in the display module in the exemplary embodiment of the invention has creep characteristics equal to or greater than about 10 percent (%) and equal to or smaller than about 30% at a temperature of about 60° C. The creep characteristics may be identified by measuring an initial deformation amount after applying a constant force to the adhesive layer and measuring a final deformation amount after maintaining the same force. In detail, the creep characteristics may be calculated by the following expression "(final deformation amount-initial deformation amount)/initial deformation amount". The creep characteristics is obtained by reading a deformation degree of a sample when the adhesive film having the thickness of about 800 micrometers is put into between parallel plates (e.g., steel parallel plates each having a thickness of about 8 mm) in a creep-test mode of the Rheometer and a stress of about 2000 Pa is applied to the adhesive film at a temperature of about 60° C.

The at least one adhesive layer included in the display module in the exemplary embodiment of the invention may have the storage modulus equal to or greater than about 0.07 MPa and equal to or smaller than about 0.25 MPa at a temperature of about −20° C. and may have the storage modulus equal to or greater than about 0.03 MPa and equal to or smaller than about 0.05 MPa at a temperature of about 25° C.

In a case where an exemplary embodiment of the display module according to the invention includes a plurality of adhesive layers, the adhesive layers may have substantially the same physical properties. In an exemplary embodiment, the adhesive layers may have substantially the same storage modulus at a temperature of about 60° C. and the same creep characteristics at a temperature of about 60° C. In an exemplary embodiment, the adhesive layers may have substantially the same storage modulus at a temperature of about −20° C. and the same creep characteristics at a temperature of about 25° C.

The at least one adhesive layer included in the display module in the exemplary embodiment of the invention may have a thickness equal to or greater than about 25 micrometers and equal to or smaller than about 75 micrometers. In an exemplary embodiment, the display module may include the adhesive layers, each having the thickness equal to or greater than about 25 micrometers and equal to or smaller than about 75 micrometers. As each of the adhesive layers has the thickness equal to or greater than about 25 micrometers and equal to or smaller than about 75 micrometers, each of the functional layers included in the display module may be prevented from being detached when the display module is bent, and thereby deformation of the display module may be prevented. Preferably, the at least one adhesive layer included in the display module in an exemplary embodiment may have a thickness equal to or greater than about 40 micrometers and equal to or smaller than about 60 micrometers, for example. In an exemplary embodiment, each of the adhesive layers included in the display module may have a thickness of about 50 micrometers, for example.

The at least one adhesive layer included in an exemplary embodiment of the display module according to the invention may have a peel force in terms of gram-force per inch (gf/in) equal to or greater than about 1000, for example. In an exemplary embodiment, the display module may include the adhesive layers, each having the peel force (gf/in) equal to or greater than about 1000, for example. In a case where each adhesive layer satisfies the above-mentioned range, an adhesive for long-term reliability may be achieved. The peel force may mean a value measured when an adhesive member is attached to a PET substrate, left at a room temperature for about 20 minutes, and peeled about 180 degrees at a speed of about 300 millimeter per minute (mm/min) using a texture analyzer.

In an exemplary embodiment, the at least one adhesive layer included in an exemplary embodiment of the display module according to the invention may include at least one base polymer including at least one of acrylic polymers, silicone polymers, polyesters, polyurethanes, polyamides, polyvinyl ethers, vinyl acetate-vinyl chloride copolymers, epoxy resins, and modified polyolefins, however, it should not be limited thereto or thereby.

In an exemplary embodiment, the at least one adhesive layer included in an exemplary embodiment of the display module according to the invention may further include additives such as a crosslinking agent and a tackifier in addition to the base polymer. The additives may be used alone or in combination of two or more thereof.

Figure 4A:
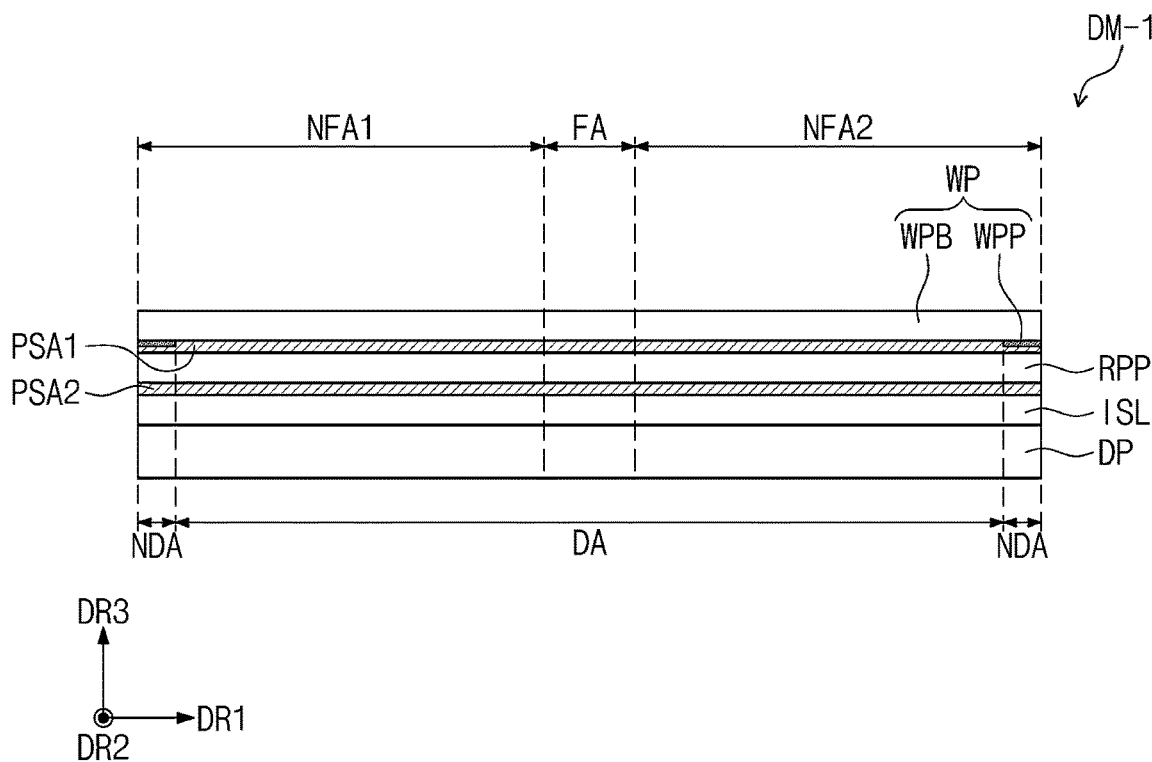
FIGS. 4A to 4G are cross-sectional views showing an exemplary embodiment of display modules according to the invention.

As shown in FIG. 4A, the display module DM-1 may include a display panel DP, an input sensing layer ISL, an anti-reflection panel RPP, and a window WP. The input sensing layer ISL is directly disposed on the display panel DP. In the following descriptions, the expression "a component "B" is directly disposed on a component "A"" means that no intervening elements, such as an adhesive layer/an adhesive member, are between the component "B" and the component "A". The component "B" is disposed on a base surface provided by the component "A" through continuous processes after the component "A" is provided.

The display panel DP generates an image, and the input sensing layer ISL obtains coordinate information on an external input, for example, a touch event.

An exemplary embodiment of the display panel DP according to the invention may be a light emitting type display panel, however, it should not be particularly limited. In an exemplary embodiment, the display panel DP may be an organic light emitting display panel or a quantum dot light emitting display panel, for example. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative exemplary embodiment of the display panel DP.

The input sensing layer ISL may include a plurality of insulating layers and a plurality of conductive layers. The conductive layers may form a sensing electrode sensing the external input, a sensing line connected to the sensing electrode, and a sensing pad connected to the sensing line. The input sensing layer ISL may sense the external input by a mutual capacitance method and/or a self-capacitance method, however, the input sensing method should not be limited thereto or thereby.

The anti-reflection panel RPP may reduce a reflectance of an external light incident thereto from the above of the window WP. The anti-reflection panel RPP in the exemplary embodiment of the invention may include a retarder and a polarizer. In an exemplary embodiment, the retarder may be a film type or liquid crystal coating type and may include a $\lambda/2$ retarder and/or a $\lambda/4$ retarder, for example. The polarizer may be a film type or liquid crystal coating type. The film type polarizer may include a stretching type synthetic resin film, and the liquid crystal coating type polarizer may include liquid crystals aligned in a predetermined alignment. The retarder and the polarizer may further include a protective film. The retarder and the polarizer or the protective film may be defined as a base layer of the anti-reflection panel RPP.

The anti-reflection panel RPP in the exemplary embodiment of the invention may include color filters. The color filters may have a predetermined alignment. The alignment of the color filters may be determined by taking into account light emitting colors of the pixels included in the display panel DP. The anti-reflection panel RPP may further include a black matrix disposed adjacent to the color filters.

The anti-reflection panel RPP in the exemplary embodiment of the invention may include a destructive interference structure. In an exemplary embodiment, the destructive interference structure may include a first reflection layer and a second reflection layer, which are disposed on different layers from each other, for example. A first reflection light and a second reflection light, which are respectively reflected by the first reflection layer and the second reflection layer, may interfere destructively with each other, and thus the reflectance of the external light may be reduced.

The window WP in the exemplary embodiment of the invention includes a base film WPB and a light blocking pattern WPP. The base film WPB includes a glass substrate and/or a synthetic resin film. The base film WPB should not be limited to a single-layer structure. The base film WPB may include two or more films coupled to each other by an adhesive member.

The light blocking pattern WPP partially overlaps with the base film WPB. The light blocking pattern WPP is disposed on a rear surface of the base film WPB to define a bezel area of the display device DD, i.e., a non-display area NDA.

The light blocking pattern WPP may be a colored organic layer and may be provided by a coating method. Although not shown in drawing figures, the window WP may further include a functional coating layer disposed on an entire surface of the base film WPB. The functional coating layer may include an anti-fingerprint layer, an anti-reflection layer, and a hard coating layer. In FIGS. 4B to 4G, the window WP and a window layer WL are briefly shown without distinguishing the base film WPB from the light blocking pattern WPP.

In an exemplary embodiment, each of the window WP, the input sensing layer ISL, the anti-reflection panel RPP, and the display panel DP may have a thickness equal to or greater than about 30 micrometers and equal to or smaller than about 60 micrometers, for example.

A first adhesive layer PSA1 may be disposed between the window WP and the anti-reflection panel RPP, and a second adhesive layer PSA2 may be disposed between the input sensing layer ISL and the anti-reflection panel RPP. In an exemplary embodiment, each of the first adhesive layer PSA1 and the second adhesive layer PSA2 may have a storage modulus equal to or greater than about 0.02 MPa and equal to or smaller than about 0.045 MPa at a temperature of about 60° C. and may have creep characteristics equal to or greater than about 10% and equal to or smaller than about 30% at a temperature of about 60° C., for example. In an exemplary embodiment, the first adhesive layer PSA1 and the second adhesive layer PSA2 may have substantially the same storage modulus and creep characteristics as each other at the temperature of about 60° C., for example.

Figure 4B:
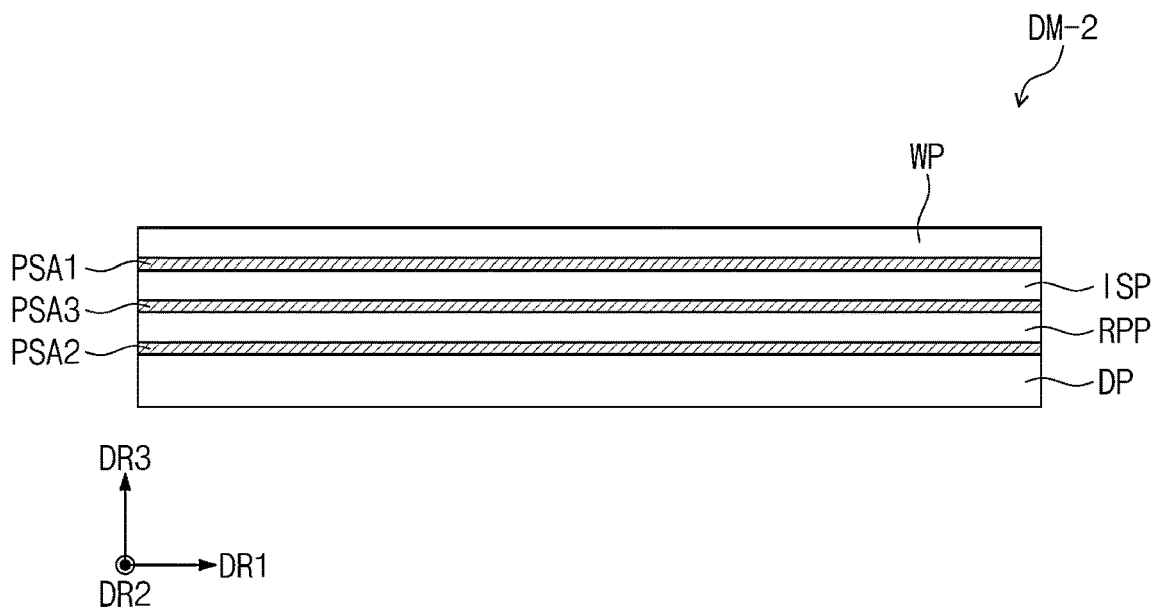
Figure 4C:
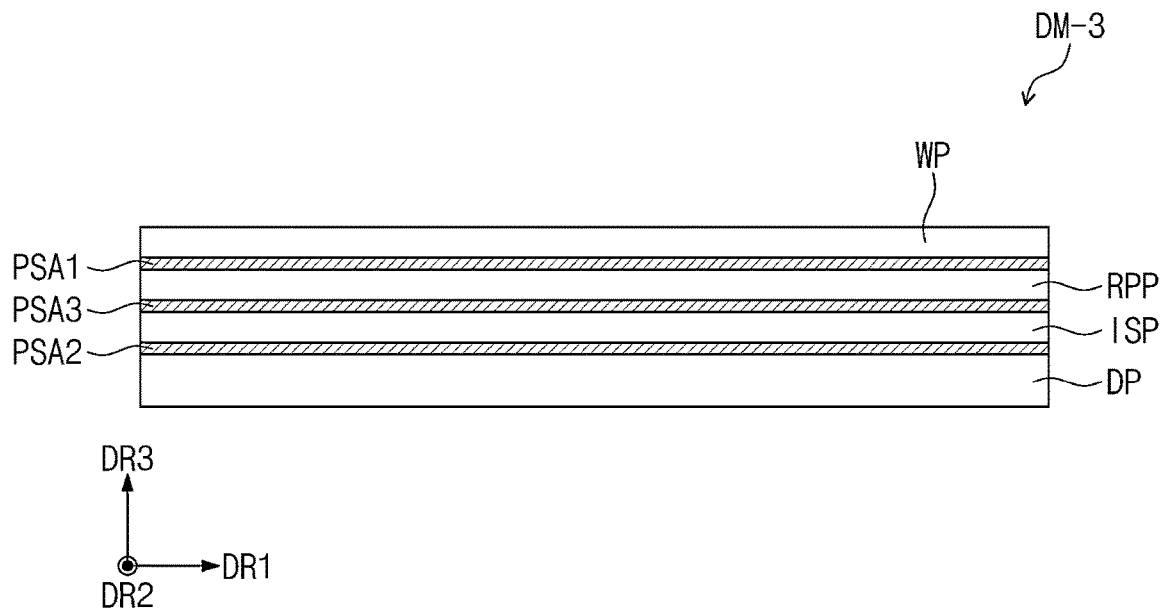

As shown in FIGS. 4B and 4C, each of the display modules DM-2 and DM-3 may include a display panel DP, an input sensing panel ISP, an anti-reflection panel RPP, and a window WP. A stacking order of the input sensing panel ISP and the anti-reflection panel RPP of the display module DM-2 may be different from a stacking order of the input sensing panel ISP and the anti-reflection panel RPP of the display module DM-3.

A third adhesive layer PSA3 may be disposed between the input sensing panel ISP and the anti-reflection panel RPP. In an exemplary embodiment, the third adhesive layer PSA3 may have a storage modulus equal to or greater than about 0.02 MPa and equal to or smaller than about 0.045 MPa at a temperature of about 60° C. and may have creep characteristics equal to or greater than about 10% and equal to or smaller than about 30% at a temperature of about 60° C., for example. The third adhesive layer PSA3 may have substantially the same storage modulus and creep characteristics as those of the first adhesive layer PSA1 and the second adhesive layer PSA2 at the temperature of about 60° C.

Figure 4D:
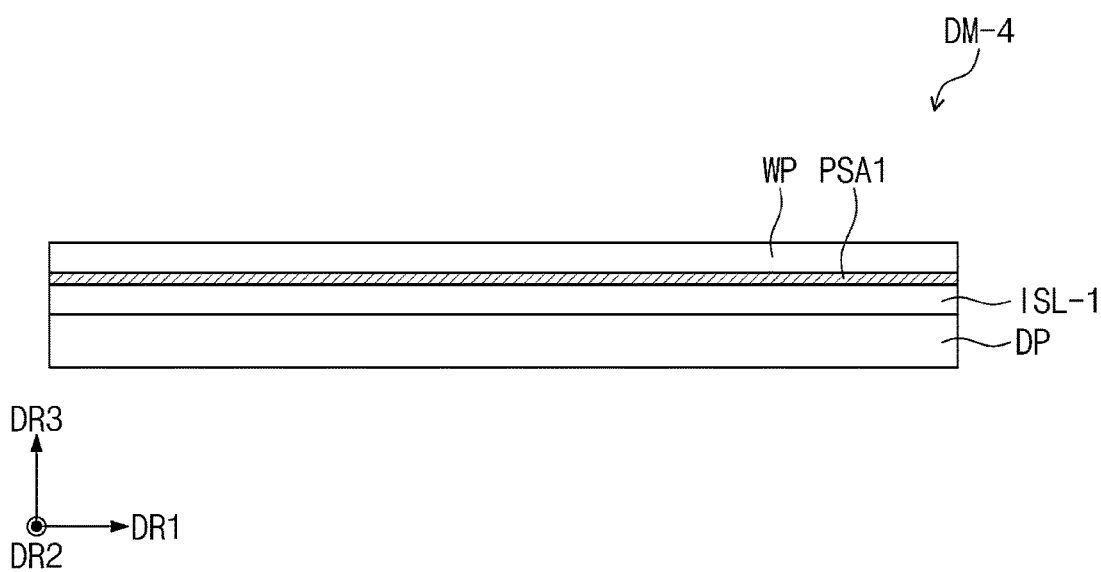
Figure 4E:
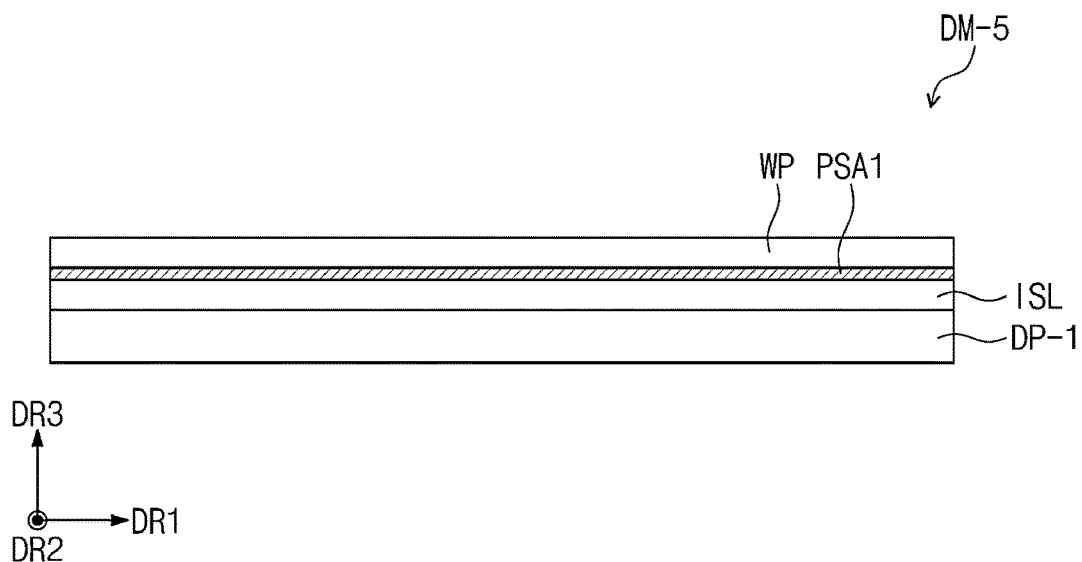

As shown in FIGS. 4D and 4E, each of the display modules DM-4 and DM-5 may not include an anti-reflection unit.

As shown in FIG. 4D, the display module DM-4 may include a display panel DP, an input sensing layer ISL-1, and a window WP. Different from the input sensing panel ISP or the input sensing layer ISL shown in FIGS. 4A to 4C, the input sensing layer ISL-1 according to the illustrated exemplary embodiment may further have an anti-reflection function.

As shown in FIG. 4E, the display module DM-5 may include a display panel DP-1, an input sensing layer ISL, and a window WP. Different from the display panel DP shown in FIGS. 4A to 4D, the display panel DP-1 according to the illustrated exemplary embodiment may further have an anti-reflection function.

In an exemplary embodiment, each of the input sensing layer ISL-1 and the display panel DP-1 may further include a functional layer having the anti-reflection function, for example. The functional layer may be color filters having a predetermined alignment or a destructive interference structure having a stacked structure with different refractive indices, however, it should not be limited thereto or thereby.

Figure 4F:
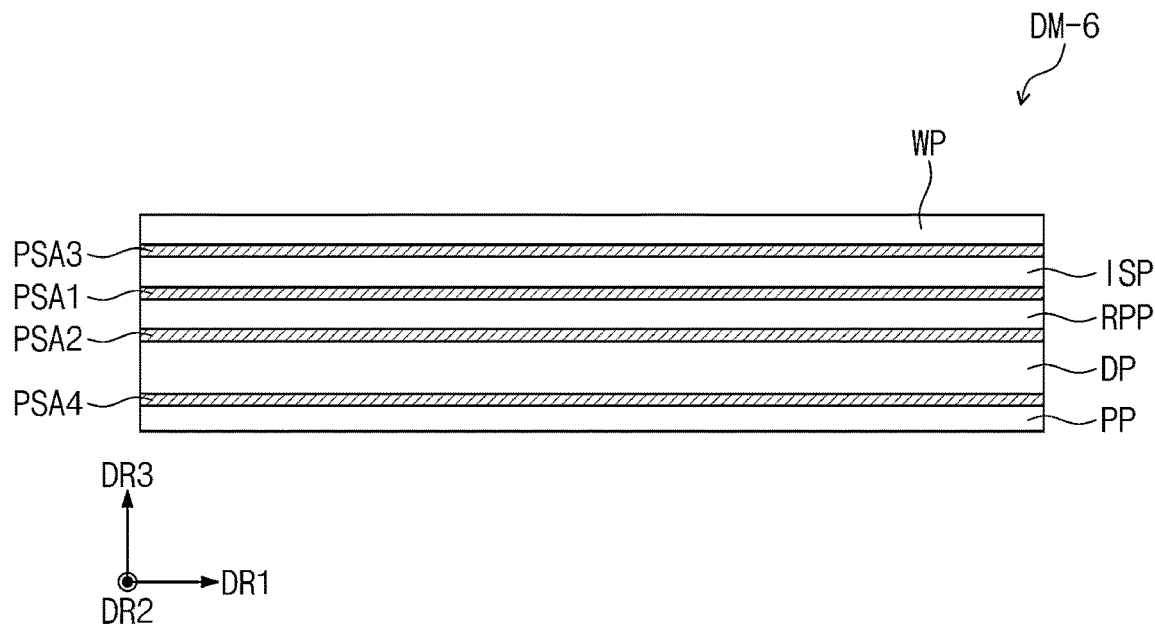
Figure 4G:
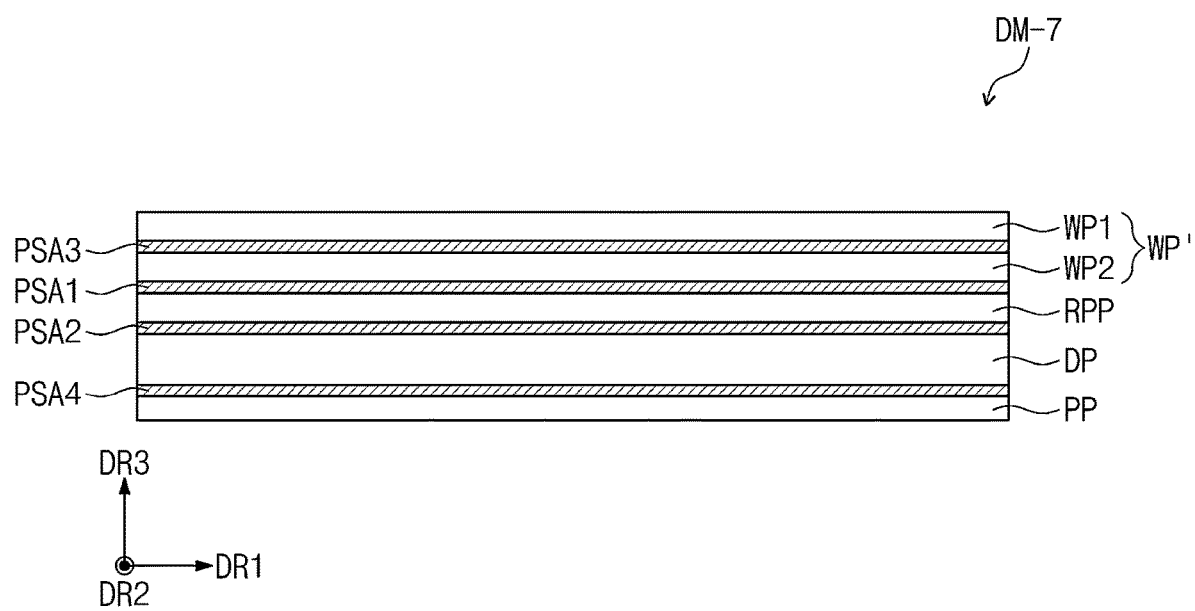

As shown in FIGS. 4F and 4G, each of the display modules DM-6 and DM-7 may further include a lower film PP disposed under a display panel DP and a fourth adhesive layer PSA4 disposed between the display panel DP and the lower film PP. The lower film PP may include a polymer material and may be a protective layer that absorbs external impacts applied thereto to prevent the external impact from being transmitted to the display panel DP.

In an exemplary embodiment, a fourth adhesive layer PSA4 may have a storage modulus equal to or greater than about 0.02 MPa and equal to or smaller than about 0.045 MPa at a temperature of about 60° C. and may have creep characteristics equal to or greater than about 10% and equal to or smaller than about 30% at a temperature of about 60° C., for example. The fourth adhesive layer PSA4 may have substantially the same storage modulus and creep characteristics as those of the first adhesive layer PSA1, the second adhesive layer PSA2, and the third adhesive layer PSA3 at the temperature of about 60° C.

The fourth adhesive layer PSA4 may have a thickness different from that of the first adhesive layer PSA1, the second adhesive layer PSA2, and the third adhesive layer PSA3. In an exemplary embodiment, the thickness of the fourth adhesive layer PSA4 may be equal to or greater than about 5 micrometers and equal to or smaller than about 20 micrometers, for example.

As shown in FIG. 4G, a window WP' included in the display module DM-7 may include a plurality of layers. The window WP' may include a first window layer WP1 and a second window layer WP2, and the third adhesive layer PSA3 may be disposed between the first window layer WP1 and the second window layer WP2. When compared with the display module DM-6 of FIG. 4F, the input sensing panel ISP may be omitted and the window WP' may include the plural window layers WP1 and WP2 in the display module DM-7 of FIG. 4G, however, the structure of the display module DM-7 should not be limited thereto or thereby. That is, the display module may include all the input sensing panel ISP and the window WP' including a plurality of window layers. As another example, the input sensing layer ISL (refer to FIG. 4A) may be directly disposed on the display panel DP, and the window WP' may include a plurality of window layers.

Figure 5A:
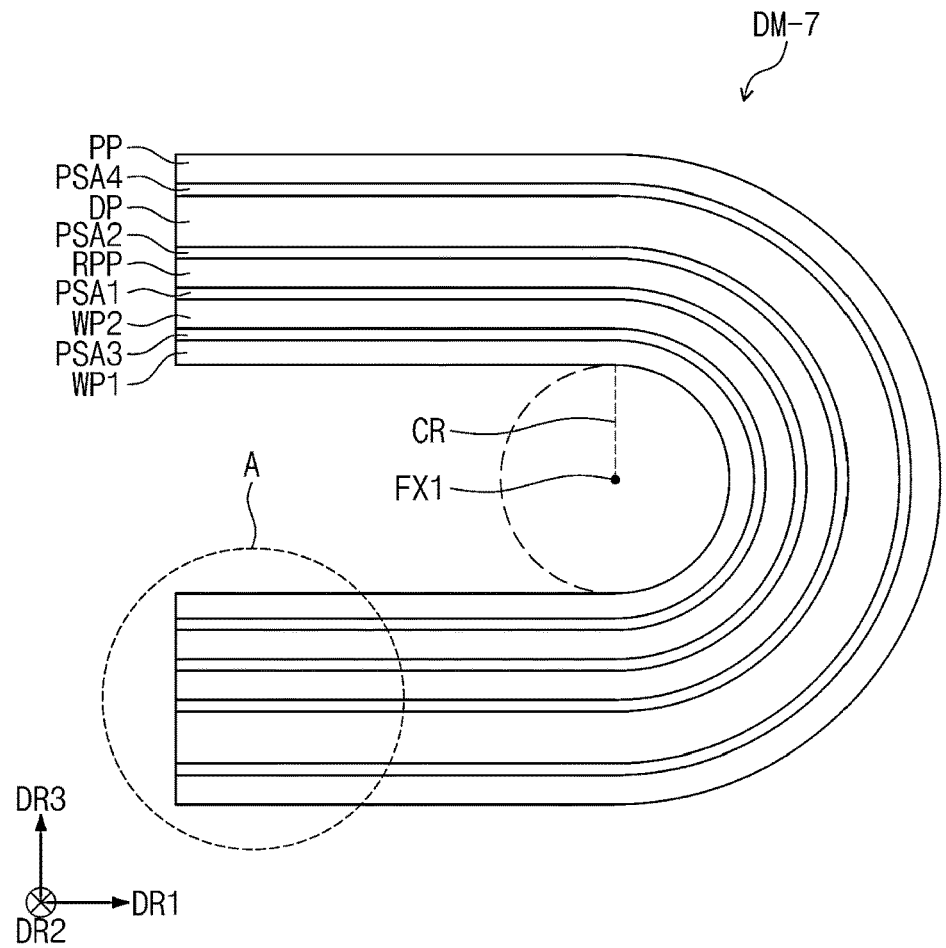
FIG. 5A is a cross-sectional view showing an exemplary embodiment of a folded state of a display module according to the invention.
Figure 5B:
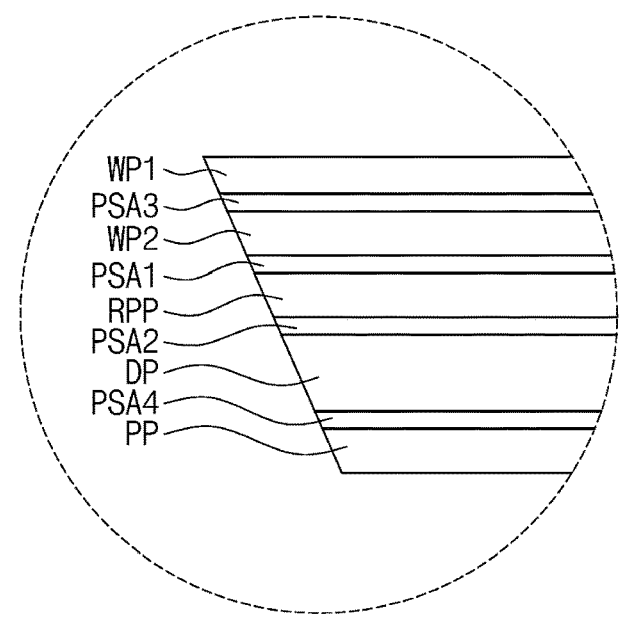
FIG. 5B is an enlarged cross-sectional view of a portion of the display module illustrated in FIG. 5A.

FIG. 5A is a cross-sectional view showing a folded state of an exemplary embodiment of a display module according to the invention. FIG. 5B is an enlarged cross-sectional view of a display module illustrated in FIG. 5A. In FIG. 5B, an enlarged area A of FIG. 5A is illustrated. FIG. 5A shows the folded state of the display module DM-7 shown in FIG. 4G, however, the folded display module may be one of the display modules DM-1, DM-2, DM-3, DM-4, DM-5, and DM-6 shown in FIGS. 4A to 4F.

In an exemplary embodiment, the display module DM-7 in the exemplary embodiment of the invention may have a radius of curvature CR equal to or greater than about 1.0R and equal to or smaller than about 2.0R, i.e., a radius of curvature equal to or greater than about 10 mm and equal to or smaller than about 20 mm, with respect to the first folding axis FX1 in the in-folding state, for example.

As shown in FIGS. 5A and 5B, when the display module DM-7 including the display panel, the functional layers, and the adhesive layers is folded, components respectively disposed inside and outside the folding axis may have different radius of curvatures from each other. Accordingly, cross sections of both ends of the display module DM-7 may have an inclined form ("A" portion of FIG. 5A) in the folded state. In detail, the display module DM-7 may have a structure in which the lower film PP, the fourth adhesive layer PSA4, the display panel DP, the second adhesive layer PSA2, the anti-reflection panel RPP, the first adhesive layer PSA1, the second window layer WP2, the third adhesive layer PSA3, and the first window layer WP1 are sequentially stacked from the outside to the inside direction with respect to the first folding axis FX1. In the folded state, the display module DM-7 may have the form inclined along the first direction DR1 toward the lower film PP disposed at an outermost side from the first window layer WP1 disposed at an innermost side.

In the display module in the exemplary embodiment, when the display module is folded, the components of the display module may have the different radius of curvatures due to the thickness of each component included in the display module, and the both ends of the display module may be inclined in the folded state. In addition, due to the difference in radius of curvature, the folded components may be subjected to different compressive and tensile forces. Therefore, each component included in the display module may be peeled or the cracks may occur in each components. In particular, since the storage modulus of the adhesive member usually decreases as the temperature changes from a low temperature to a high temperature and the creep characteristics increases as the temperature changes from the low temperature to the high temperature, a large compressive or tensile force may occur in each component of the display module when the display module is folded or unfolded after the adhesive member is deformed at high temperature.

In the display module in the exemplary embodiment of the invention, the display panel and the functional layers may be attached to each other by the adhesive layer having the storage modulus equal to or greater than about 0.02 MPa and equal to or smaller than about 0.045 MPa at the temperature of about 60° C. and the creep characteristics equal to or greater than about 10% and equal to or smaller than about 30% at the temperature of about 60° C. Thus, each layer and the panel included in the display module may be prevented from being peeled even though the display module is repeatedly folded under high temperature/high humidity conditions, and thereby the occurrence of cracks in each layer/panel may be prevented.

Figure 6:
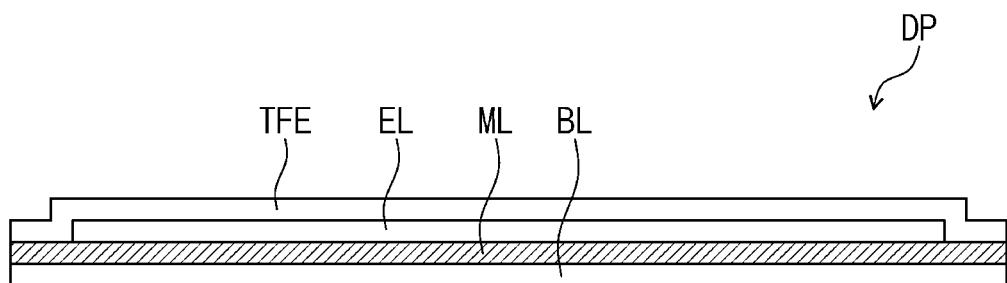
FIG. 6 is a cross-sectional view showing an exemplary embodiment of a display panel according to the invention.

FIG. 6 is a cross-sectional view showing an exemplary embodiment of a display panel according to the invention.

Referring to FIG. 6, the display panel DP may include a base layer BL, a circuit layer ML, a light emitting element layer EL, and a thin film encapsulation layer TFE.

The base layer BL may include a flexible material. In an exemplary embodiment, the base layer BL may be, but not limited to, a plastic substrate, for example. In an exemplary embodiment, the plastic substrate may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin, for example. As an example, the base layer BL may include a single-layer structure of the polyimide-based resin, however, it should not be limited thereto or thereby. That is, the base layer BL may be a stacked structure including a plurality of insulating layers.

The circuit layer ML may be disposed on the base layer BL. The circuit layer ML may include a plurality of insulating layers, a plurality of conductive layers, and a semiconductor layer.

The light emitting element layer EL may be disposed on the circuit layer ML. In an exemplary embodiment, the light emitting element layer EL may include a display element, e.g., organic light emitting diodes.

The thin film encapsulation layer TFE may encapsulate the light emitting element layer EL. The thin film encapsulation layer TFE may include a plurality of inorganic layers and at least one organic layer disposed between the inorganic layers.

Figure 7:
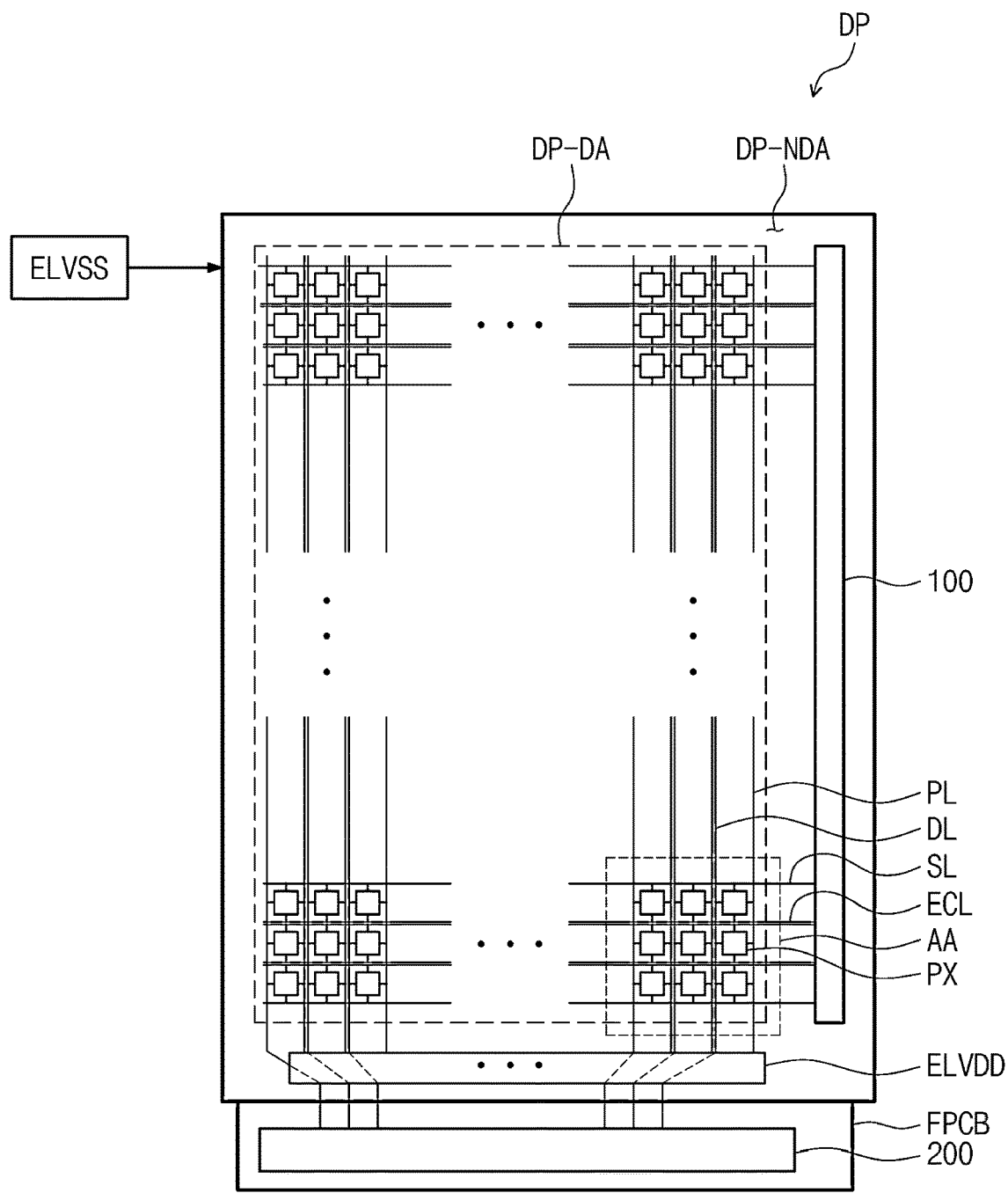
FIG. 7 is a block diagram showing an exemplary embodiment of a display panel according to the invention.
Figure 7:
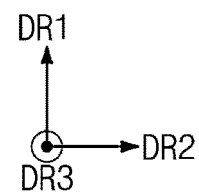

FIG. 7 is a block diagram showing an exemplary embodiment of the display panel DP according to the invention.

The display panel DP includes a display area DP-DA and a non-display area DP-NDA in a plan view. In the illustrated exemplary embodiment, the non-display area DP-NDA may be defined along an edge of the display area DP-DA. The display area DP-DA and the non-display area DP-NDA of the display panel DP may respectively correspond to the display area DA and the non-display area NDA of the display device DD shown in FIG. 1A.

The display panel DP may include a scan driver 100, a data driver 200, a plurality of scan lines SL, a plurality of light emitting control lines ECL, a plurality of data lines DL, a plurality of power lines PL, and a plurality of pixels PX. The pixels PX are arranged in the display area DP-DA. Each of the pixels PX includes a light emitting element LD (refer to FIG. 8) and a pixel circuit CC (refer to FIG. 8) connected to the light emitting element LD.

The scan driver 100 may include a scan driving circuit and a light emitting control driving circuit.

The scan driving circuit generates scan signals and sequentially applies the generated scan signals to the scan lines SL. The light emitting control driving circuit generates light emitting control signals and applies the generated light emitting control signals to the light emitting control lines ECL.

In another exemplary embodiment of the invention, the scan driving circuit and the light emitting control driving circuit may be implemented in one circuit without being distinguished from each other.

In an exemplary embodiment, the scan driver 100 includes a plurality of thin film transistors provided through the same process, e.g., a low temperature polycrystalline silicon ("LTPS") process or a low temperature polycrystalline oxide ("LTPO") process, as the driving circuit of the pixels.

The data driver 200 applies data signals to the data lines DL. The data signals are analog voltages corresponding to grayscale values of image data.

In an exemplary embodiment of the invention, the data driver 200 may be disposed (e.g., mounted) on a printed circuit board FPCB, and the printed circuit board FPCB may be connected to pads arranged at one ends of the data lines DL. However, the data driver 200 should not be limited thereto or thereby and may be directly disposed (e.g., mounted) on the display panel DP.

The scan lines SL may extend in the second direction DR2 and may be arranged in the first direction DR1 crossing the second direction DR2. In the exemplary embodiment of the invention, the first direction DR1 and the second direction DR2 may be perpendicular to each other, however, they should not be limited thereto or thereby.

The light emitting control lines ECL may extend in the second direction DR2 and may be arranged in the first direction DR1. That is, each of the light emitting control lines ECL may be arranged to be parallel to a corresponding scan line among the scan lines SL.

The data lines DL may extend in the first direction DR1 and may be arranged in the second direction DR2 crossing the first direction DR1. The data lines DL may apply the data signals to corresponding pixels PX.

The power lines PL may extend in the first direction DR1 and may be arranged in the second direction DR2. The power lines PL may apply a first power ELVDD to corresponding pixels PX.

Each of the pixels PX is connected to a corresponding scan line among the scan lines SL, a corresponding light emitting control line among the light emitting control lines ECL, a corresponding data line among the data lines DL, and a corresponding power line among the power lines PL.

Figure 8:
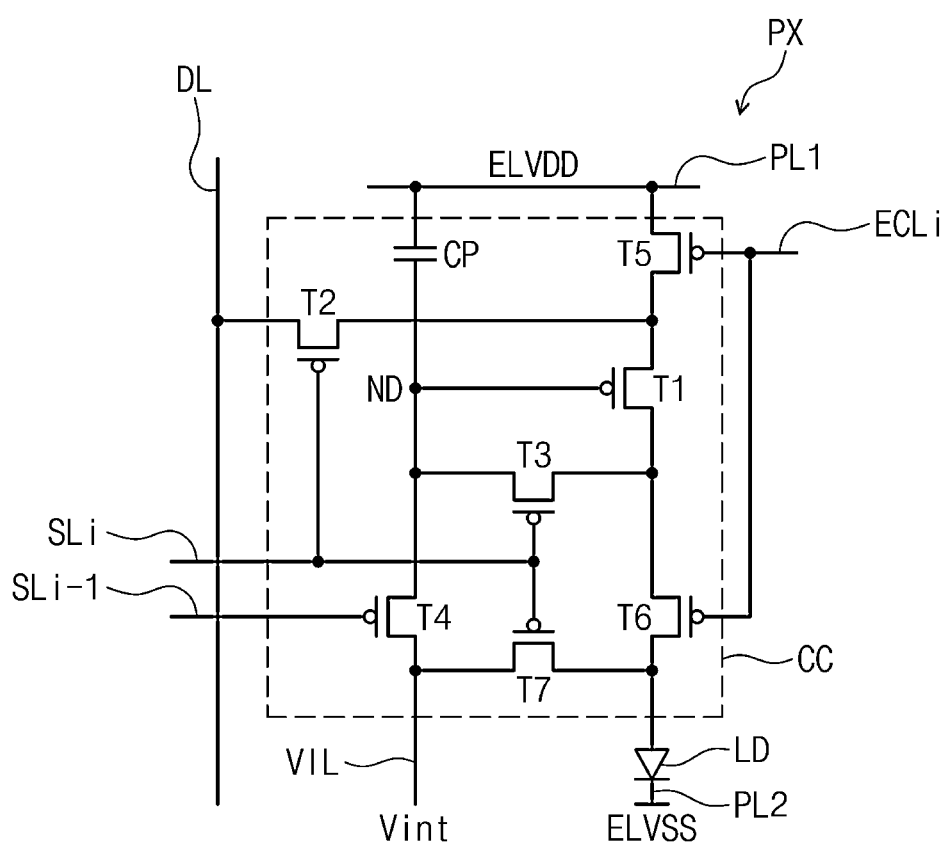
FIG. 8 is an equivalent circuit diagram showing an exemplary embodiment of a pixel according to the invention.

FIG. 8 is an equivalent circuit diagram showing an exemplary embodiment of the pixel PX according to the invention.

Referring to FIG. 8, the pixel PX is disposed in the display area DA (refer to FIG. 1A) and displays the image.

The pixel PX may be electrically connected to a plurality of signal lines. FIG. 8 shows scan lines SLi and SLi−1, a data line DL, a first power line PL1, a second power line PL2, an initialization power line VIL, and a light emitting control line ECLi among the signal lines where i is a natural number greater than one, however, they are merely exemplary. The pixel PX in the exemplary embodiment of the invention may be further connected to various signal lines, and some of the signal lines shown in FIG. 8 may be omitted.

The pixel PX may include the light emitting element LD and the pixel circuit CC. The light emitting element LD may be included in the light emitting element layer EL of FIG. 6, and the pixel circuit CC may be included in the circuit layer ML of FIG. 6.

The pixel circuit CC may include a plurality of transistors T1 to T7 and a capacitor CP. The pixel circuit CC may control an amount of current flowing through the light emitting element LD in response to a data signal.

The light emitting element LD may emit a light at a predetermined luminance in response to the amount of current provided from the pixel circuit CC. To this end, a level of the first power ELVDD may be set higher than a level of a second power ELVSS.

Each of the transistors T1 to T7 may include an input electrode (or source electrode), an output electrode (or drain electrode), and a control electrode (or gate electrode). In the following descriptions, for the convenience of explanation, one electrode of the input electrode and the output electrode may be also referred to as a "first electrode", and the other electrode of the input electrode and the output electrode may be also referred to as a "second electrode".

A first electrode of a first transistor T1 is connected to the first power line PL1 via a fifth transistor T5. The first power line PL1 may be a line to which the first power ELVDD is applied. A second electrode of the first transistor T1 is connected to an anode electrode of the light emitting element LD via a sixth transistor T6. The first transistor T1 may be also referred to as a "driving transistor".

The first transistor T1 controls the amount of current flowing through the light emitting element LD in response to a voltage applied to a control electrode of the first transistor T1.

A second transistor T2 is connected between the data line DL and the first electrode of the first transistor T1. A control electrode of the second transistor T2 is connected to an i-th scan line SLi. The second transistor T2 is turned on when an i-th scan signal is applied to the i-th scan line SLi and electrically connects the data line DL to the first electrode of the first transistor T1.

A third transistor T3 is connected between the second electrode of the first transistor T1 and the control electrode of the first transistor T1. A control electrode of the third transistor T3 is connected to the i-th scan line SLi. The third transistor T3 is turned on when the i-th scan signal is applied to the i-th scan line SLi and electrically connects the second electrode of the first transistor T1 to the control electrode of the first transistor T1. Accordingly, when the third transistor T3 is turned on, the first transistor T1 is connected in a diode configuration.

A fourth transistor T4 is connected between a node ND and the initialization power line VIL. A control electrode of the fourth transistor T4 is connected to an (i−1)th scan line SLi−1. The node ND may be a node at which the fourth transistor T4 is connected to the control electrode of the first transistor T1. The fourth transistor T4 is turned on when an (i−1)th scan signal is applied to the (i−1)th scan line SLi−1 and provides an initialization voltage Vint to the node ND.

The fifth transistor T5 is connected between the first power line PL1 and the first electrode of the first transistor T1. The sixth transistor T6 is connected between the second electrode of the first transistor T1 and the anode electrode of the light emitting element LD. A control electrode of the fifth transistor T5 and a control electrode of the sixth transistor T6 are connected to an i-th light emitting control line ECLi.

A seventh transistor T7 is connected between the initialization power line VIL and the anode electrode of the light emitting element LD. A control electrode of the seventh transistor T7 is connected to the i-th scan line SLi. The seventh transistor T7 is turned on when the i-th scan signal is applied to the i-th scan line SLi and provides the initialization voltage Vint to the anode electrode of the light emitting element LD.

The seventh transistor T7 may improve a black display performance of the pixel PX. In detail, when the seventh transistor T7 is turned on, a parasitic capacitance (not shown) of the light emitting element LD is discharged. Accordingly, when implementing a black luminance, the light emitting element LD does not emit the light due to a leakage current from the first transistor T1, and thus the black display performance may be improved.

Additionally, in FIG. 8, the control electrode of the seventh transistor T7 is connected to the i-th scan line SLi, however, it should not be limited thereto or thereby. In another exemplary embodiment, the control electrode of the seventh transistor T7 may be connected to the (i−1)th scan line SLi−1 or an (i+1)th scan line (not shown).

FIG. 8 illustrates a P-type metal-oxide-semiconductor ("PMOS") as a reference of the pixel circuit CC, however, it should not be limited thereto or thereby. In another exemplary embodiment, the pixel circuit CC may be implemented by an N-type metal-oxide-semiconductor ("NMOS"). In another exemplary embodiment, the pixel circuit CC may be implemented by a combination of the NMOS and the PMOS.

The capacitor CP is disposed between the first power line PL1 and the node ND. The capacitor CP is charged with a voltage corresponding to the data signal. When the fifth and sixth transistors T5 and T6 are turned on due to the voltage charged in the capacitor CP, the amount of the current flowing through the first transistor T1 may be determined.

The light emitting element LD may be electrically connected to the sixth transistor T6 and the second power line PL2. The light emitting element LD may receive the second power ELVSS via the second power line PL2.

The light emitting element LD may emit the light at the voltage corresponding to a difference between the signal provided through the sixth transistor T6 and the second power ELVSS provided through the second power line PL2.

In the invention, the structure of the pixel PX should not be limited to the structure shown in FIG. 8. In another exemplary embodiment of the invention, the pixel PX may be implemented in various ways to allow the light emitting element LD to emit the light.

Hereinafter, the invention will be described in more detail with reference to Embodiment examples and Comparative examples. The following Embodiment examples are merely exemplary to help an understanding of the invention, and the invention should not be limited thereto or thereby.

Embodiment Example 1

A display module of Embodiment example 1 was obtained by attaching a polarizing member having a thickness of about 31 micrometers to a display panel having a thickness of about 34 micrometers using a first PSA having a thickness of about 50 micrometers. Then, an input sensing panel having a thickness of about 55 micrometers was attached onto the polarizing member using a second PSA having a thickness of about 50 micrometers, and a window having a thickness of about 50 micrometers was attached onto the input sensing panel using a third PSA having a thickness of about 50 micrometers. A hard coating layer having a thickness of about 10 micrometers was disposed on the window.

In the comparative examples, the storage modulus of the PSA at a temperature of about 60° C. was changed from that of the display module of Embodiment example 1, or some PSAs (e.g., PSA2 of Comparative example 2 in Table 1 below) and the functional layers included in the display module were removed. The exemplary embodiment examples and the comparative examples were measured for reliability evaluation. The reliability evaluation was obtained by evaluating the reliability for 240 hours at 60° C./93% (temperature 60° C. and humidity 95%) with an in-folding state of about 1.5R, a reliability for 240 hours at a thermal shock condition with an in-folding state of about 1.5R, a reliability for 240 hours at a temperature of about 85° C. with an in-folding state of about 1.5R, and a reliability for 240 hours at a temperature of about −40° C. with an in-folding state of about 1.5R. The evaluated results are shown in Table 1 below.

TABLE 1

| | | Storage modulus at about −20° C. (MPa) | Storage modulus at about 60° C. (MPa) | Creep characteristics at about 60° C. (%) | Reliability evaluation result |
|---|---|---|---|---|---|
| Embodiment example 1 | PSA1 | 0.09 | 0.03 | 18 | Good reliability |
| | PSA2 | 0.09 | 0.03 | 18 | |
| | PSA3 | 0.09 | 0.03 | 18 | |
| Embodiment example 2 | PSA1 | 0.15 | 0.04 | 20 | Good reliability |
| | PSA2 | 0.15 | 0.04 | 20 | |
| | PSA3 | 0.15 | 0.04 | 20 | |
| Embodiment example 3 | PSA1 | 0.15 | 0.045 | 28 | Good reliability |
| | PSA2 | 0.15 | 0.045 | 28 | |
| | PSA3 | 0.15 | 0.045 | 28 | |
| Comparative example 1 | PSA1 | 0.06 | 0.02 | 34 | Peeled |
| | PSA2 | 0.10 | 0.03 | 18 | |
| | PSA3 | 0.10 | 0.03 | 18 | |
| Comparative example 2 | PSA1 | 0.15 | 0.041 | 20 | Crack occurrence, peeled |
| | PSA2 | — | — | — | |
| | PSA3 | 0.15 | 0.041 | 20 | |
| Comparative example 3 | PSA1 | 0.1 | 0.03 | 18 | Crack occurrence, peeled |
| | PSA2 | 0.15 | 0.041 | 0.03 | |
| | PSA3 | 0.06 | 0.014 | 16 | |

TABLE 1-continued

| | | Storage modulus at about −20° C. (MPa) | Storage modulus at about 60° C. (MPa) | Creep characteristics at about 60° C. (%) | Reliability evaluation result |
|---|---|---|---|---|---|
| Com-parative example 4 | PSA1 | 0.10 | 0.03 | 18 | Crack occurrence, peeled (low temperature condition) |
| | PSA2 | 0.10 | 0.03 | 18 | |
| | PSA3 | 0.28 | 0.02 | 30 | |

Referring to Table 1, since the adhesive layers included in the display modules of Embodiment examples 1 to 3 have the storage modulus equal to or greater than about 0.02 MPa and equal to or smaller than about 0.045 MPa at about 60° C. and have the creep characteristics equal to or greater than about 10% and equal to or smaller than about 30% at about 60° C., the peeling and the cracks do not occur under high temperature/high humidity conditions, and thus, the reliability of the display module may be secured. In the display modules of Comparative examples 1 to 3, since at least one layer among the adhesive layers included in the display modules does not satisfy the above-mentioned storage modulus at about 60° C. or does not satisfy the above-mentioned creep property at about 60° C., the peeling defects occur under high temperature/high humidity conditions. In particular, the storage modulus and/or the creep characteristics at about 60° C. of the first PSA disposed between the display panel and the polarizing member in Comparative examples 1 and 2 do not satisfy the above-mentioned ranges, and thus the cracks occur and the peeling defects occur. In Comparative example 3, the storage modulus of the third PSA disposed between the input sensing panel and the window does not satisfy the above-mentioned ranges, and thus the cracks occur and the peeling defects occur.

For each adhesive layer in Comparative example 4, both the storage modulus at 60° C. and the creep characteristics at 60° C. are satisfied, but the storage modulus of the third PSA disposed between the input sensing panel and the window do not satisfy the range of the above-mentioned storage modulus equal to or greater than about 0.07 MPa and equal to or smaller than about 0.25 MPa at about −20° C., and thus the cracks occur and the peeling defects occur under the low temperature condition.

Although the exemplary embodiments of the invention have been described, it is understood that the invention should not be limited to these exemplary embodiments but various changes and modifications may be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display module including a first non-folding area, a folding area, and a second non-folding area, which are sequentially arranged in a first direction, and being in-folded with respect to a folding axis disposed on the folding area, the display module comprising:
    window;
    a first adhesive layer disposed under the window;
    an anti-reflection layer disposed under the first adhesive layer;
    a display panel disposed under the anti-reflection layer; and
    a lower adhesive layer disposed under the display panel,
    wherein at least one of the window, the anti-reflection layer, and the display panel has a thickness equal to or greater than about 30 micrometers and equal to or smaller than about 60 micrometers, and
    the first adhesive layer has a thickness equal to or greater than about 25 micrometers and equal to or smaller than about 75 micrometers.

2. The display module of claim 1, wherein the anti-reflection layer has a thickness equal to or greater than about 30 micrometers and equal to or smaller than about 60 micrometers.

3. The display module of claim 1, wherein the thickness of the lower adhesive layer is smaller than the thickness of the first adhesive layer.

4. The display module of claim 3, wherein the lower adhesive layer has a thickness equal to or greater than about 5 micrometers and equal to or smaller than about 20 micrometers.

5. The display module of claim 1, both ends of the display module have an inclined form in the folded state.

6. The display module of claim 1, wherein the window comprises a first window, a second window disposed between the first window and the display panel, and an additional adhesive layer disposed between the first window and the second window.

7. The display module of claim 1, wherein the folding area has a radius of curvature of the folding area which is equal to or greater than about 1.0R and equal to or smaller than about 2.0R.

8. The display module of claim 1, wherein at least one of the first adhesive layer and the lower adhesive layer has creep characteristics equal to or greater than about 10 percent and equal to or smaller than about 30 percent.

9. The display module of claim 1, wherein the first adhesive layer has a storage modulus equal to or greater than about 0.02 megapascal and equal to or smaller than about 0.045 megapascal at a temperature of about 60 degrees Celsius.

10. A display module including a first non-folding area, a folding area, and a second non-folding area, which are sequentially arranged in a first direction, and being in-folded with respect to a folding axis disposed on the folding area, the display module comprising:
    window;
    a first adhesive layer disposed under the window;
    an anti-reflection layer disposed under the first adhesive layer;
    a display panel disposed under the anti-reflection layer; and
    a lower adhesive layer disposed under the display panel,
    wherein the thickness of the lower adhesive layer is smaller than the thickness of the first adhesive layer.

11. The display module of claim 10, at least one of the window, the anti-reflection layer, and the display panel has a thickness equal to or greater than about 30 micrometers and equal to or smaller than about 60 micrometers.

12. The display module of claim 10, the first adhesive layer has a thickness equal to or greater than about 25 micrometers and equal to or smaller than about 75 micrometers.

13. The display module of claim 10, wherein the lower adhesive layer has a thickness equal to or greater than about 5 micrometers and equal to or smaller than about 20 micrometers.

14. The display module of claim 10, wherein the anti-reflection layer has a thickness equal to or greater than about 30 micrometers and equal to or smaller than about 60 micrometers.

15. The display module of claim 10, both ends of the display module have an inclined form in the folded state.

16. The display module of claim 10, wherein at least one of the first adhesive layer and the lower adhesive layer has creep characteristics equal to or greater than about 10 percent and equal to or smaller than about 30 percent.

17. The display module of claim 10, wherein the first adhesive layer has a storage modulus equal to or greater than about 0.02 megapascal and equal to or smaller than about 0.045 megapascal at a temperature of about 60 degrees Celsius.

18. The display module of claim 10, further comprising a second adhesive layer disposed under the anti-reflection layer.

19. The display module of claim 18, the first adhesive layer and the second adhesive layer have a same storage modulus and same creep characteristics at a temperature of about 60 degrees Celsius.

\* \* \* \* \*